United States Patent [19]

Witmer

[11] Patent Number: 4,882,203

[45] Date of Patent: Nov. 21, 1989

[54] HEATING ELEMENT

[75] Inventor: Warner H. Witmer, Bethlehem, Pa.

[73] Assignee: CVD Systems & Services, Quakertown, Pa.

[21] Appl. No.: 267,538

[22] Filed: Nov. 4, 1988

[51] Int. Cl.⁴ .............................................. H01L 21/02

[52] U.S. Cl. .................................... 427/124; 219/543; 437/187

[58] Field of Search ................ 219/541, 543; 427/123, 427/124, 96, 99, 97, 252, 269, 275, 307, 314, 399; 156/647, 653, 657, 659.1, 662; 148/DIG. 1; 437/192, 173, 174, 200, 245, 246; 29/846, 847

[56] References Cited

U.S. PATENT DOCUMENTS

| | | | |
|---|---|---|---|
| 3,351,438 | 11/1967 | Milner et al. | 75/248 |
| 4,650,696 | 3/1987 | Raby | 437/200 |
| 4,745,089 | 5/1988 | Orbin | 437/200 |

OTHER PUBLICATIONS

"Selective Low Pressure Chemical Vapor Deposition of Tungsten" by Broadbent and Raimiller, Solid State Science and Technology, Jun. 1984, pp. 1427–1433.

"Tungsten CVD: Application to Submicron VLSIC'S" by Itoh, et al, Solid State Technology, Nov. 1987, pp. 83–87.

"Progress in LPCVD Tungsten For Advanced Micro-electronic, Applications" by Blewer, Solid State Technology, Nov. 1986, pp. 117–126.

"Tungsten Nucleation on Thermal Oxide During LPCVD of Tungsten by the Hydrogen Reduction of Tungsten Hexafloride" by McConica and Cooper, Solid State Science and Technology, vol. 135, No. 4, Apr. 1988, pp. 1003–1008.

"CVD Tungsten–A Solution for the Poor Step Coverage and High Contact Resistance of Aluminum" by Brors, et al, Solid State Technology, Apr. 1984, pp. 313–314.

"Growth of Selective Tungsten on Self-Aligned Ti and Ttni Silicides by Low Pressure Chemical Vapor Deposition" by Broadbent, Morgan, et al, Solid State Technology, Aug. 1986, vol. 133, No. 8, pp. 1715–1721.

*Primary Examiner*—A. D. Pellinen
*Assistant Examiner*—Leon K. Fuller
*Attorney, Agent, or Firm*—Ferrill & Logan

[57] ABSTRACT

A process for fabricating a heating element comprising the following steps: surface protecting a silicon object by forming a protective layer by means of thermal oxidation, CVD or suitable alternative method; selectively etching away said protective layer so as to form a pattern to permit the formation of wire-like regions for a desired heater configuration; exposing the silicon object to halogenated tungsten gas at a reaction temperature of between 250° and 500° centigrade so as to chemically reduce a layer of tungsten onto the exposed silicon; and then coating the composite structure with a corrosion and oxidation resistant layer.

22 Claims, 2 Drawing Sheets

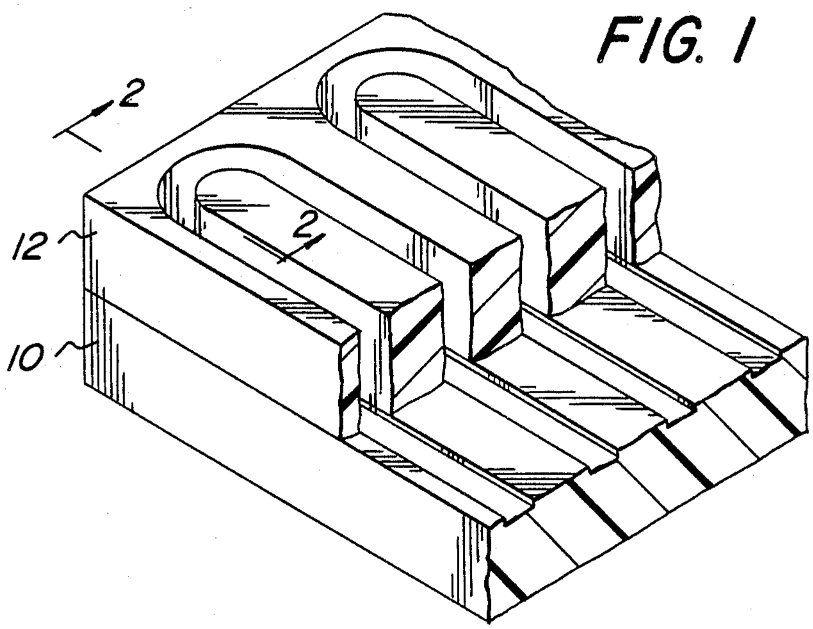
FIG. 1
FIG. 2
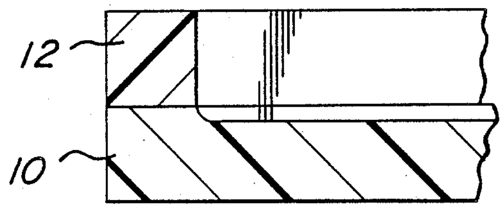
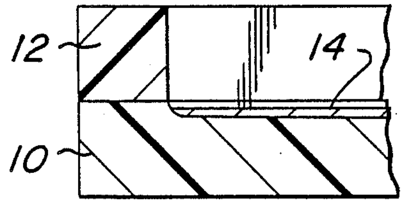
FIG. 3
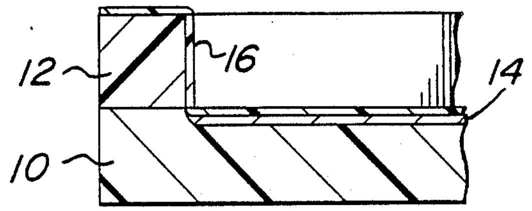
FIG. 4
FIG. 5
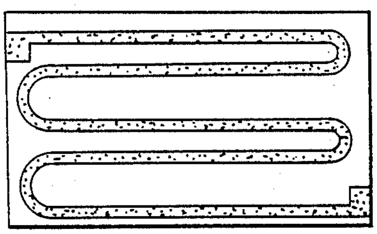

FIG. 6
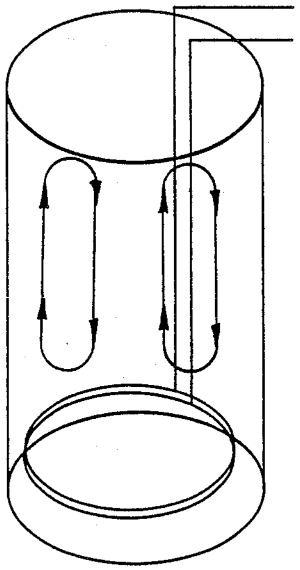
FIG. 7
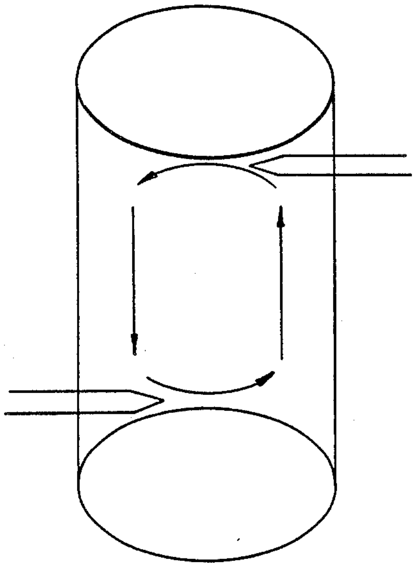
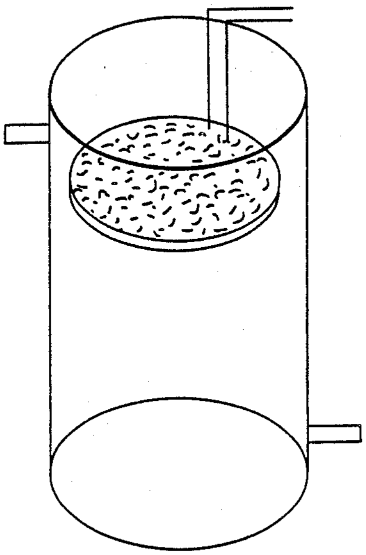
FIG. 8

HEATING ELEMENT

BACKGROUND OF THE INVENTION

Spacecraft require lightweight, high efficiency, long lasting, high heat/low energy thermal electrical elements for both manned and unmanned vehicles. Traditionally these requirements have been met using wire-type heating elements. However, traditional wire-type heating elements require coatings for oxidation and corrosion resistance. Moreover, such heating elements are expensive to fabricate, bulky, and consume large amounts of power during operation. Devices of this type are also fragile and have relatively short lifetimes.

The present invention is directed to a process for fabricating solid state, reliable thermal heating elements having (1) a low thermal mass, (2) extremely high corrosion resistances, (3) uniform heat output over large areas, (4) excellent thermal heat transfer characteristics, and (5) maximum electric power efficiency with minimum weight using a novel low cost process. The solid state devices produced by the present invention satisfy all the above-stated heating element requirements and can be applied in tiny microelectronic heating elements, immersion heaters, and liquid and solid heating units, including very-large-area radiant heating panels.

It is well known that tungsten has the highest melting point and lowest vapor pressure of all metals. Tungsten is obtained commercially by reducing tungsten oxide with hydrogen or carbon. Pure tungsten is steel-gray to tin-white in color. The impure metal is brittle and can be worked only with difficulty. Pure tungsten can be cut with a hacksaw and can further be forged, spun, drawn, and extruded. It is the extrusion property combined with its high melting point that facilitates the use of tungsten in light filaments. Unfortunately, tungsten oxidizes at about 450° C. Therefore, a high vacuum is required to assure long incandescent filament lifetime. Even tiny quantities of water vapor or oxygen in the bulb greatly reduce filament lifetime.

An added problem attendant to the use of tungsten is the requirement for additives like potassium, silicon, and aluminum in order to allow proper swaging and wire-drawing. Moreover, these additives in tungsten wire are detrimental when tungsten filaments are used in evaporation processes involving other materials, because some of the impurities get into the pure metal being evaporated. Also, outgassing of these materials can affect the lifetime of tungsten light bulbs. A final problem associated with tungsten is the migration of impurities along grain boundries in tungsten filaments, which eventually causes cracking of the wire.

Traditionally, incandescent lamps have been fabricated by the following procedure. First, tungsten acid (W03:H20) is added to potassium silicate in an amount such that the potassium content in the KCl is 0.40%, the silicon content in $SiO_2$ is 0.30%, and $Ga(NO_3)3$ is added in an amount such that the Ga content expressed in GA203 is 0.05%. This paste is then dried, dehydrated at 300° C., and reduced in a hydrogen furnace at a temperature of 850° C. or higher. The metal powder prepared by this procedure is processed by high pressure extrusion and sintered into a rod. At this stage of the process, crystals are visible on the surface of the rod. Subsequently, the rod is processed through wire drawing dies using swaging, or other mechanical wire drawing techniques, in order to produce incandescent wire for light bulbs. The specific process steps used, the impurity content, and the size of the tungsten crystals actually formed are critical factors in achieving the mechanical shock resistance, wire break resistance, and incandescent properties required for luminescense. The drawn wire is next spiraled into a filament to increase the potential lumens per unit area. The ends of the filament are then welded to conductive support wires which are then attached to a socket support. This socket support with filament assembly is then inserted into the bulb, sealed, and subsequently, the air in the bulb is removed using an indexing mechanical vacuum pumping assembly to assure formation of a high vacuum within the bulb so as to prevent oxidation of the tungsten filament.

A second method for forming a tungsten incandescent filament is described in U.S. Pat. No. 3,811,936 whereby a drawn tungsten filament wire is increased in cross-sectional area by means of hydrogen reduction of tungsten hexafluoride onto the hot filament. By this means, purer tungsten filament wires can be fabricated.

Heating elements comprising electrical resistance wire supported by ceramic materials are also known in the art and are described, for example, by Pauls in U.S. Pat. No. 3,436,540. Heating elements comprising electric resistance wire sealed into or supported by ceramic insulators, such as nichrome wire tightly sealed into an alumina/silica ceramics, is described by Erickson in U.S. Pat. No. 4,596,922. Other forms of heating elements use metal foil etched into a serpentine pattern whereby application of electric power allows heating of the metal. Devices of this type are usually supported back and front by use of insulating panels. A heating element of the foil type is described, for example, by Furtek in U.S. Pat. No. 4,659,906. Gyuris describes use of a heavy metal foil etched into a grid-like pattern to allow electrical resistance heating of electric irons or other electrical applicances in U.S. Pat. No. 2,553,762.

In the semiconductor industry large tube-type heating elements, sometimes a foot in diameter and several feet long are also used to heat silicon wafers. Because of the heavy wire required for the high temperatures of these operations, a considerable mass of insulating material is required. Relatively expensive stepdown transformers or silicon controlled rectifiers are required to provide the high amperages required to operate such heavy resistance wire as a consequence of the fact that a good deal of the energy produced by the electrical elements is wasted through dissipation into the insulating material.

In summary, the present state of the art has relied on wires, etched metal foils, and resistive metal bars supported by heavy refractory materials to accomplish resistance heating. Difficulty has been experienced in the manufacture of such elements because a large number of closely-spaced wire or foil elements must be held in close proximity by use of insulating materials that are hard to fabricate and have a non-matching coefficient of expansion. To hold such wires and foils in alignment a considerable amount of refractory insulator is required, which in turn, results in considerable wasted heat and electrical energy. Consequently, it has thus far been extemely difficult to provide heating elements having sufficient rigidity and mechanical strength to prevent buckling and contracting of adjacent resistance wire segments while minimizing wasted heat.

While heating element manufacture and use has heretofore encountered the above-discussed problems associated with prior art fabrication methods, materials combining Silicon/Quartz/Tungsten provide an ideal system for solid state heating elements. Initially, no metallic material matches the coefficient of thermal expansion of silicon better than tungsten. This property is extremely important for the thermal cycling required by a solid state heater. The melting points of these components and the eutectics formed are also very important. The melting point of silicon is very high (1410 degrees C.), and tungsten is almost 2½ times higher (3410 degrees C.). Further, quartz, which is used to provide the corrosion resistant covering over the tungsten, melts at a temperature higher than silicon (1665 degrees C.). The eutectic temperature of alloy formation of tungsten/silicon occurs at 1400° C. The vapor pressures of all three materials and their combinations are extremely low at elevated temperatures. The electrical resistivity of tungsten provides excellent properties as a heater material, having about one-half the resistivity of platinum and substantially less resistivity than nickel. The thermal conductivity of silicon is good, better than that of nickel, and about equal to tungsten.

All of the above considerations are important for a successful solid state heater. Because of the applicability of the Silicon/Tungsten/Quartz system to microelectronic applications, the metallurgical system has been well-characterized and researched. Thus, most of the basic materials development has already been performed. The results of recent studies have predicted that a tungsten-silicon metalization system will provide much more reliability than an aluminum-silicon system, normally used for IC manufacture, because of the much more optimum thermal expansion coefficient match of tungsten/silicon (i.e., 4.5/3) compared to the much greater mismatch of aluminum/silicon (i.e., 25/3).

Another major advantage of the tungsten/silicon system is that "spiking" and electromigration of the metallic element does not occur even at elevated temperatures in this system. These phenomena have plagued IC and rectifier manufacturers who use the aluminum/silicon system for years. The problem causes eventual shorting of IC's because of electrical current induced electromigration of the aluminum. To attempt overcoming the problem aluminum interconnect metal has been alloyed with copper and silicon making it necessary to use expensive sputtering processes at IC manufacture.

In summary it would be highly desirable if incalescent tungsten filament heating elements could be formed in association with high purity silicon material. This would eliminate expensive wire drawing operations, and the requirement for refactory materials supporting the wires as is required by the prior art. Further, it would be desirable to accomplish this as a solid state device by inherently low cost process steps. This is the main goal of the present invention herein described.

A second objective of the present invention is to provide a method for making a resistive heating element in which a desired complex heating electrode pattern is easily fabricated.

A further objective of the invention is to provide a method for making resistive heating elements wherein wire and foil, with their attendant attachment and alignment problems, are eliminated.

It is another objective of the present invention to provide improved thermal contact of the heating electrodes to the substrate support material.

It is still yet another objective of the present invention to allow formation of resistive electrodes in intimate contact with substrate materials of many differing types [not only refractories but also metals].

Another objective of the invention is to allow formation of resistive electrodes to objects of complex topology.

Another objective of the invention is to allow formation of resistive heating elements particularly resistant to corrosion.

Finally, it is an objective of the present invention to Provide new lightweight electrical heating elements having very low thermal mass such that fast thermal rise and cooling times are possible.

SUMMARY OF THE INVENTION

In accordance with the present invention, a process for fabricating a heating element utilizing the following steps is disclosed. First, an object of silicon is surface-protected by forming a layer of $SiO_2$by means of thermal oxidation. Secondly, the protective layer is selectively etched away so as to form a pattern to permit the formation of wire-like regions for a desired heater configuration. The silicon is next exposed to tungsten hexafluoride gas heated to a temperature of between 250° C. and 500° C. so as to form a layer of tungsten on the exposed silicon by means of selective chemical reduction. Finally, the composite structure is coated with an amorphous silicon layer to prevent oxidation of the tungsten and to increase corrosion resistance. The present invention further encompasses heating elements fabricated utilizing the above-stated process.

BRIEF DESCRIPTION OF THE FIGURES

FIG. 1 is a perspective view of an improved heating element produced pursuant to the process of the disclosed invention. FIGS. 2–4 illustrate a time lapse representation of the fabrication of the improved heating element of the claimed invention along line 2—2 of FIG. 1.

FIG. 5 is a planar view of the heating element of the present invention.

FIG. 6 illustrates a conventional immersion heater.

FIG. 7 illustrates a more optimum conventional heater in which the bottom heating element heats the water moderately.

FIG. 8 illustrates an improved water heater utilizing a disk-shaped heater of the present invention.

DETAILED DESCRIPTION OF THE INVENTION

The present invention is described with reference to the enclosed figures wherein the same numbers are used where applicable. Referring to FIGS. 1–4, the process begins with high resistivity silicon 10 having an amorphoric, polycrystalline, or single crystal form. The silicon 10 can be in the form of a disk, slab, block or otherwise shaped object of single crystal, polycrystalline or amorphous material. Moreover, the silicon can constitute the base material, or, in the alternative, can be CVD (Chemical Vapor Deposition) deposited onto a substrate material such as stainless steel, a ceramic such as alumina, or a glass such as quartz. For single crystal or polycrystalline silicon, standard fabrication procedures such as crystal growth, sawing, lapping, and polishing may be utilized. These procedures have been automated by the IC industry and can be accomplished at low cost. Presently, the IC industry predominantly uses 5" silicon wafers about 20 mils thick. Some large manufacturers use 6", 8", even 10"diameter silicon wafers. Polycrystalline material is fabricated by less restrictive methods in which the starting material is sand heated to a very high temperature, which is then reduced to relatively pure silicon which in turn is then molded into ingots. The ingots are subsequently sliced and lapped into slab elements by mechanical shaping methods.

The silicon starting material is initially surface-protected by forming a quartz ($SiO_2$) layer 12 thereon by means of thermal oxidation. This protective film is then selectively etched away in order to form a pattern to allow formation of wire-like regions for the desired heater configuration. In the preferred embodiment, this procedure is performed using photolithographic techniques that are dependent upon photoresists and acids, using procedures well established in the microelectronics industry. A main advantage of the photolithographic process, regarding heating elements, is that the complexity of the wire pattern desired is set by the artwork. Photolithographic processes are highly developed and the microelectronic industry can presently fabricate etched lines having widths of less than one micron in extraordinarily complex patterns. It is a feature of the present invention that the complexity of the pattern is irrelevant to the claimed process. Consequently, any heater pattern which can be artwork designed, can easily be fabricated. The preferred well-established procedure for photolithography in the present invention is to apply a thin layer of photoresist on top of the $SiO_2$ and then to expose the resist using ultraviolet light through a mask. The mask permits UV light to pass through in order to expose the underlying photoresist, so that subsequent development removes the resist in the exposed areas. Subsequently, an acid is applied to the regions where the resist is developed. The acid permits the underlying $SiO_2$ to be etched from the desired heater pattern; i.e., where the tungsten wire pattern is desired.

After the protective quartz layer over the silicon is removed using the above-discussed photolithographic etching technique, thereby forming the desired heater pattern, the photoresist is removed and the entire material is exposed to a tungsten halogen gas such as tungsten hexafluoride or tungsten hexachloride. Both the silicon object and gas are heated to between 250 and 500 degrees centigrade. The preferred temperature is 300° C. This step must be performed using the proper equipment such as the single wafer coater developed by CVD Systems and Services, assignee of the present invention, or by use of similar CVD coating apparatus. Tungsten 14 is formed in the exposed silicon regions by the reaction of the chemical reduction of tungsten hexafluoride by silicon. The reaction is preferably controlled to 300° C. by means of a heater. For this very low temperature reaction, the chemical equation is described as follows:

$$2WF_6+3Si \rightarrow 2W+3SiF_4.$$

This initial reaction actually produces a very thin underlayer of tungsten silicide beneath the the tungsten. The tungsten silicide is chemically described as $WSi_2$. The total thickness of the reacted layer is about 100 Angstrums and pure tungsten is formed by a self-limiting chemical reaction.

This part of the procedure is of particular importance from a process control standpoint. First, in order to control heater resistivity, it is only required that 2-dimensional area requirements be taken into account. In addition, because the resistivity of pure tungsten film is in the range 10–15$\mu$ ohm-cm, the total resistance can be easily determined. Further, because the reaction is specific to silicon, no tungsten deposits on adjacent $SiO_2$ surfaces; hence, the deposit "selectively" self-aligns on the exposed silicon. Morever, because approximately 20–50 atomic layers of silicon are removed during the process, the silicon on which the tungsten is deposited is virgin material, and together with the chemically selective nature of the reaction, a self-limiting deposit is obtained which exhibits excellent adhesion, reproducable contact and bulk resistance, excellent scratch resistance, and the other characteristics required for the ideal solid state heating element. Finally, the tungsten formed is coplanar and conforms with the substrate topology.

The next step in the process is to CVD coat the structure with a material such as amorphous silicon 16 for corrosion and oxidation protection. Because the underlying material is silicon, and because the expansion coefficient of tungsten closely matches silicon, amorphous silicon is the preferred material. It is further possible to oxidize the amorphous silicon coating directly on the tungsten heater structure or to CVD coat silicon dioxide thereon. Because silicon oxide is quartz, the heater assembly now has a coating in intimate contact for thermal transfer which also has excellent corrosion resistive properties. Further, it is also possible to CVD coat the quartz layer with silicon nitride in order to provide even better corrosion protection.

The above procedure provides an inherently low cost process for a wide variety of heating requirements. No physical wires need be produced, thereby minimizing the cost of the process. Further, the conductor patterns are coplanar with the silicon substrate, and intimately attached, thereby eliminating the possibility of loose or breaking wires. Further, the silicon substrate 10 can take any shape or topology because CVD coating process is conformal. The thermal transfer through the thin film coated layers allows extremely efficient heat transfer to a surrounding gas, liquid or solid.

In a second embodiment, a process for fabricating the solid state heater with a substrate material other than single crystal or polycrystalline silicon is utilized. Amorphous silicon is CVD deposited onto a substrate having characteristics required to match the thermal and chemical properties of the amorphous silicon substrate, thereby facilitating attachment and adhesion. Quartz, ceramics, glasses, and some metals meet this requirement. One low cost material which has been successfully coated with amorphorous silicon is stainless steel.

The steps described previously for fabrication of the subsequent metalized pattern and the subsequent coatings for corrosion protection are identical to those of the first embodiment. However, because of the elimination of the requirement for single crystal or polycrystalline silicon, the fabrication of which is relatively expensive, the most desirable features of the alternative embodiment are low cost and the use of alternative substrates. By this means, for example, it is possible to coat quartz tubes inside and out with silicon, then form tungsten spiral heating elements both inside the tube and outside the tube for much increased thermal heating uniformity, at very low cost. Slab heaters can be fabricated this way. Very large panel radiant heaters operating at high electrical efficiency should be possible whereby amorphous silicon is deposited onto stainless steel sheets for use in space heating rooms and compartments.

All of the above described process steps have been used to fabricate solid state heater elements. The appearance of the heating element wiring pattern prior to coating is silver metallic, with the surrounding oxide having a blue color. In one embodiment, a silicon wafer of thickness 17 mils was the substrate for the tungsten heat pattern, although heating elements having up to an 80 mils thickness and 5" diameter were also fabricated. In addition, tiny 1" and 2" square, 5 mil thick heating elements have been fabricated whereby the heating element orientation one side has been aligned so that the pattern is interleaved with the heater pattern the opposite side. By this procedure extremely uniform thermal heating has been accomplished. Application of electricity to these thin elements has permitted very rapid heat increases because of the low thermal mass and rapid cooling, and because of their efficient radiant heat transfer to the surrounding air.

TEST EXAMPLE

To test the structures, wires from a Variac heater were pinned to electrode pads then, at a reduced voltage/current, the device was tested to determine its thermal properties. At approximately 80 V AC, a 4" diameter heater assembly got so hot it could not be touched, and water dropped onto the device boiled and evaporated. When the applied power was increased so as to raise the temperature of the device to temperatures somewhat above 150° C., the element experienced no degradation. Evaporated water spots which quickly discolored the heater were easily removed by immersion of the solid state heating element into chromic acid then DI water rinsing whereby the heater again became metallic bright (like chrome).

OPERATIVE EXAMPLE

One immediate use for the electric heating element of the present invention is for heating water in a manner that should save energy, not only because of the electrical power savings, but because a disk-shaped heater could be conveniently used in water heaters.

FIG. 6 illustrates a conventional immersion type heater wherein circulation of heated water occurs along the flowlines shown, and thermal mixing occurs. This thermal intermixing is not desirable because only that volume of heated water required should be available for the intended use. The balance of the water in the tank should only be at moderate temperature so that it can be quickly heated at the top of the tank. FIG. 7 illustrates a more optimum water heater design whereby the bottom heating element only heats the water moderately. Since hot water rises, the upper heater supplies heat to assure a volume of water at required temperature only in the volume normally required (for example, to wash a user's hands). This system is also not very efficient because intermixing occurs.

Finally, referring to FIG. 8, a disk-shaped heater of the present invention is shown. The heater of the present invention permits heating of the upper water volume only (if insulated on the bottom) while allowing warmed water to rise as required around the periphery of the disk for better controlled hot water heating. This system inhibits the thermal circulation which normally occurs with conventional hot water heaters.

While the claimed invention has been described with reference to the above description and figures, it will be appreciated by those skilled in the art that other embodiments fall within the spirit and scope of the invention and that the true nature and scope of the invention is more properly determined from the claims attached hereto.

What is claimed is:

1. A process for fabricating a heating element comprising the following steps:
   a. surface protecting a silicon object by forming a protective $SiO_2$ layer by means of thermal oxidation;
   b. etching away said protective layer so as to form wire-like regions for a desired heater pattern;
   c. exposing the silicon object to a tungsten halogen gas at a temperature of between 250° and 500° centigrade so as to form a layer of tungsten on the exposed silicon object by chemical reduction; and
   d. coating the composite structure with an amorphic silicon layer for corrosion and oxidation protection.

2. The process of claim 1 wherein said protective $SiO_2$ layer is formed by chemical vapor deposition.

3. The process of claim 1 wherein said silicon object is a crystal.

4. The process of claim 3 wherein the crystal of silicon is in the form of a disk.

5. The process of claim 3 wherein the crystal of silicon is in the form of a shaped block.

6. The process of claim 1 wherein said gas is tungsten hexafluoride.

7. The process of claim 1 wherein said gas is tungsten hexachloride.

8. The process of claim 1 wherein the wire-like regions are formed using the following process:
   a. applying a thin layer of photoresist on top of the $SiO_2$;
   b. exposing the photoresist to ultra violet light through a mask;
   c. applying an acid to the regions where the photoresist is exposed to ultraviolet light whereby the underlying $SiO_2$can be etched away.

9. The process of claim 1 wherein the reacted layer has a thickness of about 100 Angstroms.

10. The process of claim 1 wherein the amorphic silicon is applied using chemical vapor deposition.

11. A heating element produced using the following process:
   a. surface protecting a silicon object by forming a protective $SiO_2$layer thereon by means of thermal oxidation;
   b. selectively etching away said protective layer so as to form wire-like regions for a desired heater pattern;
   c. exposing said silicon object to a tungsten halogen gas at a temperature of between 250° and 500° centigrade so as to form a layer of tungsten on the exposed silicon by chemical reduction; and
   d. coating the composite structure with an amorphic silicon layer for corrosion and oxidation protection.

12. A process for fabricating a heating element comprising the following steps:
   a. coating a substrate with silicon;
   b. surface protecting the silicon by forming a protective $SiO_2$ layer by means of thermal oxidation or chemical vapor deposition;

c. selectively etching away said protective layer so as to form a pattern to permit the formation of wire-like regions for a desired heater pattern;

d. exposing the substrate with a silicon layer to a tungsten halogen gas heated to a temperature of between 250° and 500° centigrade so as to form a desired patterned layer of tungsten on the exposed silicon; and e. coating the composite structure with an amorphous silicon for corrosion and oxidation protection.

13. The process of claim 12 wherein the substrate consists of a metal.

14. The process of claim 13 wherein the metal is stainless steel.

15. The process of claim 12 wherein the substrate is a ceramic.

16. The process of claim 12 wherein the substrate is a glass.

17. The process of claim 12 wherein the wire-like regions are formed using the following process:

a. applying a thin layer of photoresist on top of the $SiO_2$;

b. exposing the photoresist to ultraviolet light through a mask;

c. applying an acid to the regions where the Photoresist is exposed to ultraviolet light whereby the underlying $SiO_2$ can be etched away.

18. The process of claim 12 wherein the reacted layer has a thickness of about 100 Angstroms.

19. The process of claim 12 wherein the amorphous silicon is applied using chemical vapor deposition.

20. A heating element produced using the following process:

a. coating a substrate with silicon;

b. surface protecting the silicon by forming a protective $SiO_2$ layer thereon by means of thermal oxidation or chemical vapor deposition;

c. selectvely etching away said protective layer so as to form wire-like regions for a desired heater pattern;

d. exposing the substrate with silicon layer to tungsten hexafluoride gas heated to a temperature of between 250° and 500° centigrade so as to form a desired patterned layer of tungsten on the exposed silicon; and e. coating the composite structure with an amorphic silicon layer for corrosion and oxidation protection.

21. The process of claim 20 wherein the composite structure is further coated with a layer of quartz for further oxidation and corrosion protection.

22. The process of claim 20 wherein the composite structure is further coated with a layer of silicon nitrite for further oxidation and corrosion protection.

* * * * *

UNITED STATES PATENT AND TRADEMARK OFFICE

CERTIFICATE OF CORRECTION

PATENT NO. : 4,882,203

DATED : November 21, 1989

INVENTOR(S) : Warner H. Witmer

It is certified that error appears in the above-identified patent and that said Letters Patent is hereby corrected as shown below:

Col. 4, Line 18: after "$SiO_2$" leave space before "by"

Col. 4, Line 35: after "closed invention." begin a new paragraph

Col. 8, Line 43: after "$SiO_2$" leave space before "can"

Col. 8, Line 51: after "$SiO_2$" leave space before "layer"

Signed and Sealed this

Seventh Day of May, 1991

*Attest:*

HARRY F. MANBECK, JR.

*Attesting Officer*

*Commissioner of Patents and Trademarks*